United States Patent
Cheng et al.

(10) Patent No.: US 7,663,953 B2
(45) Date of Patent: Feb. 16, 2010

(54) METHOD FOR HIGH SPEED SENSING FOR EXTRA LOW VOLTAGE DRAM

(75) Inventors: Hank Cheng, Taichung (TW);
Chen-Hui Hsieh, Chu-Pei (TW);
Chung-Cheng Chou, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 409 days.

(21) Appl. No.: 11/684,811

(22) Filed: Mar. 12, 2007

(65) Prior Publication Data
US 2008/0225617 A1 Sep. 18, 2008

(51) Int. Cl.
*G11C 7/00* (2006.01)
(52) U.S. Cl. .......................... 365/205; 365/207; 365/226
(58) Field of Classification Search ................. 365/205, 365/207, 226, 189.09, 222, 185.18, 189.03, 365/230.06, 203, 189.11
See application file for complete search history.

(56) References Cited

U.S. PATENT DOCUMENTS

| | | | |
|---|---|---|---|
| 5,659,260 A * | 8/1997 | Kajimoto et al. ............... | 327/55 |
| 6,205,049 B1 * | 3/2001 | Lien et al. .................... | 365/154 |
| 6,411,160 B1 | 6/2002 | Riho et al. | |
| 6,728,151 B2 * | 4/2004 | Joo ............... | 365/205 |
| 6,961,278 B2 | 11/2005 | Jeong | |
| 2003/0174533 A1 | 9/2003 | Ito | |
| 2007/0133327 A1 | 6/2007 | Huang | |
| 2007/0268764 A1 * | 11/2007 | Kim et al. .................... | 365/205 |

FOREIGN PATENT DOCUMENTS

KR 20020045959 A 6/2002

* cited by examiner

*Primary Examiner*—Dang T Nguyen
(74) *Attorney, Agent, or Firm*—Duane Morris LLP

(57) ABSTRACT

A method and apparatus are provided for sensing in low voltage DRAM memory cells. A method according to one embodiment includes: providing a DRAM circuit having a memory cell, a sense amplifier including a pre-charge circuit connected to a first voltage source and a back-to-back inverter including a first and second NMOS transistor, each having a source and a first and second PMOS transistor, each having a source. The method further includes the steps of maintaining the voltage of the sources of the first and second NMOS transistors at a first voltage during normal operation and lowering the voltage of the sources of the first and second NMOS transistors from the first voltage to a second voltage during a read operation.

17 Claims, 6 Drawing Sheets

METHOD FOR HIGH SPEED SENSING FOR EXTRA LOW VOLTAGE DRAM

FIELD OF THE INVENTION

The invention relates to electrical circuits and more specifically to DRAM memory circuits and sensing the state thereof.

BACKGROUND

In a dynamic random access memory ("DRAM"), data is stored as a logic high value (e.g., "1") or logic low value (e.g., "0") by the presence or absence of charge on a capacitor within an individual memory cell. After the data has been stored as a charge on the capacitor, the charge gradually leaks off and the data becomes corrupted. Therefore, a "refresh" cycle must be performed before passage of sufficient time for the data to become corrupted, to maintain the integrity of the data.

To read data from a memory array, the array is typically placed in a read mode to obtain the data currently stored in a row of memory cells. An individual datum is typically accessed through the cell address, which identifies a memory cell by its row and column in the array.

FIG. 1 illustrates a prior art DRAM circuit 100 having a first storage bit 132 and a second storage bit 126. First storage bit 132 is passed by a first PMOS transistor 130, and second storage bit 126 is passed by a second PMOS transistor 128. PMOS transistor 130 is coupled to sense amplifier 102 via bit line BL, and PMOS transistor 128 is coupled to sense amplifier 102 via bit line bar ZBL. Sense amplifier 102 includes pre-charge circuit 104, back-to-back inverter 112 and two NMOS transistors 122, 124, which have their gates tied to column selection line SL. Pre-charge circuit 104 is comprised of three NMOS transistors 106, 108, 110, which have their gates tied to equalization line EQ.

The back-to-back inverter 112 is comprised of two PMOS transistors 114, 116 and two NMOS transistors 118, 120. Both NMOS transistors 118, 120 have low threshold voltages for reasons discussed below. The gates of NMOS transistor 120 and PMOS transistor 116 are tied together and coupled to both the bit line bar ZBL and the drains of NMOS transistor 118 and PMOS transistor 114, which are also tied together. The gates of NMOS transistor 118 and PMOS transistor 114 are tied together and coupled to the bit line BL, and the drains of NMOS transistor 120 and PMOS transistor 116, which are also tied together. The sources of the PMOS transistors 114, 116 are tied together, as are the sources of the NMOS transistors 118, 120. The sources of the PMOS transistors 114, 116 are also coupled to a high voltage source $V_{DD}$ via line SP and PMOS transistor 134. PMOS transistor 134 has its gate connected to control line CL1. The sources of the NMOS transistors 118, 120 are coupled to ground $V_{SS}$ via line SN.

With reference to FIGS. 1 and 2, the reading of a "0" from the first storage bit 132 of prior art DRAM circuit 100 is now discussed. Initially at time t=0, DRAM circuit 100 is in normal operation (i.e., retaining previously stored data, but not being written to, read from or refreshed) and equalization line EQ is coupled to a logic "1" signal, When equalization line EQ is coupled to a logic "1," the three NMOS transistors 106, 108, 110 of pre-charge circuit 104 are in the "on" state, and lines ZBL and BL are charged to the voltage of $V_{BL}$, The voltage of $V_{BL}$ is typically half the voltage of $V_{DD}$ (assuming a $V_{SS}$ voltage of 0.0 volts). Also in this state, control line CL1 is connected to a high voltage signal, which turns PMOS transistor 134 to the "off" state resulting in $V_{DD}$ being disconnected from sense amplifier 112.

The read cycle begins at time t=1, when equalization line EQ is coupled to a logic "0" signal. PMOS transistor 130, which controls the first storage bit 132, is selected by transitioning line WL from a high voltage to low voltage. The transition of line WL from a high voltage to a low voltage turns PMOS transistor 130 from the "off" state to the "on" state. With PMOS transistor 130 on, the voltage of the first storage bit 132 is then coupled to bit line BL. Since bit line BL has a larger bit line capacitance than the capacitance of the capacitor of the first bit 132, the voltage of line BL is pulled down slightly.

Line SP is then coupled to $V_{DD}$ by having control line CL1 transition from a high voltage to a low voltage, which transitions PMOS transistor 134 from the "off" state to the "on" state. With PMOS transistor 134 on, the voltage of $V_{DD}$ is then connected to the gates of both PMOS transistors 114 and 116 of the back-to-back inverter 112, thereby changing the PMOS transistors 114, 116 from the "off" state to the "on" state. The turning on of PMOS transistors 114 and 116 pulls down the voltage of line BL while the voltage of line ZBL is pulled up. The pulling down of line BL and pulling up of line ZBL occurs because $V_{DD}$ pulls up the voltage of line ZBL via PMOS transistor 114, and $V_{SS}$ pulls down the voltage of line BL via NMOS transistor 120.

FIG. 2 is a diagram showing voltage versus time and illustrates certain signals of DRAM circuit 100 as they transition during the normal operating phase and the read phase. Of particular interest are the signals of lines ZBL and BL as they illustrate the slow transitioning from their initial voltage level at $V_{BL}$ at time t−1 to their respective voltage levels at $V_{DD}$ and $V_{SS}$ at time t=2. As illustrated in FIG. 2, the transition of both BL and ZBL from their initial voltage to their final voltages is slow, as the slopes of the lines indicate a gradual transition.

Due to the continually shrinking size of integrated circuits, the operating voltage $V_{DD}$ is continually being reduced, which reduces the ability of $V_{DD}$ to pull up ZBL. The reduced ability of $V_{DD}$ to pull up ZBL results in a delay in the transition of ZBL (an increase in the time between t=1 and t=2), and slowing the speed at which the circuit functions.

Some attempts to speed up the pulling up of ZBL by $V_{DD}$ have been made, including boosting the voltage level of $V_{DD}$ during the reading cycle. However, the boosting of $V_{DD}$ during the reading cycle increases power consumption of the DRAM circuit and does not dramatically speed up the reading time of a "0" from the storage bit. To help increase the ability of $V_{SS}$ to pull down the voltage on line BL, NMOS transistors 118, 120 are typically low threshold voltage transistors. Manufacturing circuits with different threshold voltages requires additional manufacturing processing, as all of the transistors of the circuit cannot be formed by the same steps. The additional manufacturing steps, such as additional photolithographic steps, drive up the time and cost of production.

Therefore, it is desirable in the art to provide an apparatus and method which overcomes the disadvantages of the prior art.

SUMMARY OF THE INVENTION

An improved DRAM circuit and a method for high speed sensing in extra low voltage DRAM circuits are described herein. In one embodiment the DRAM circuit comprises at least one memory cell including a capacitor, a transistor and at least one sense amplifier. The at least one sense amplifier includes a pre-charge circuit and a back-to-back inverter. The back-to-back inverter has at least one PMOS transistor and at least one NMOS transistor, wherein the source of the at least one PMOS transistor is coupled to a first voltage source which has a voltage higher than ground. The source of the at least one NMOS transistor is coupled to a switch, wherein the switch is operable to connect the source of the NMOS transistor to one of a second voltage source set at ground and a third voltage source set at a negative voltage relative to the voltage of the second voltage source.

In another exemplary embodiment, the DRAM circuit comprises at least one memory cell and at least one sense amplifier connected to the memory cell. The at least one sense amplifier includes a pre-charge circuit connected to a first voltage source and a back-to-back inverter connected to the pre-charge circuit. The back-to-back inverter comprises a first PMOS transistor having a source, a second PMOS transistor having a source, a first NMOS transistor having a source and a second NMOS transistor having a source. The sources of the first and second PMOS transistors are connected to a second voltage source and the sources of the first and second NMOS transistors are configured to selectively connect to one of a third positive voltage source and a fourth voltage source having a lower voltage than the voltage of the third voltage source.

In another exemplary embodiment, the disclosure relates to a method of high speed sensing of a DRAM circuit comprising the steps of providing a DRAM circuit having a memory cell, a sense amplifier including a pre-charge circuit connected to a first voltage source and a back-to-back inverter including a first NMOS transistor having a source, a second NMOS transistor having a source, a first PMOS transistor having a source and a second PMOS transistor having a source. The method further includes the steps of maintaining the voltage of the sources of the first and second NMOS transistors at a first voltage during normal operation and lowering the voltage of the sources of the first and second NMOS transistors from the first voltage to a second voltage during a refresh operation.

DETAILED DESCRIPTION

This description of the exemplary embodiments is intended to be read in connection with the accompanying drawings, which are to be considered part of the entire written description.

Figure 3:
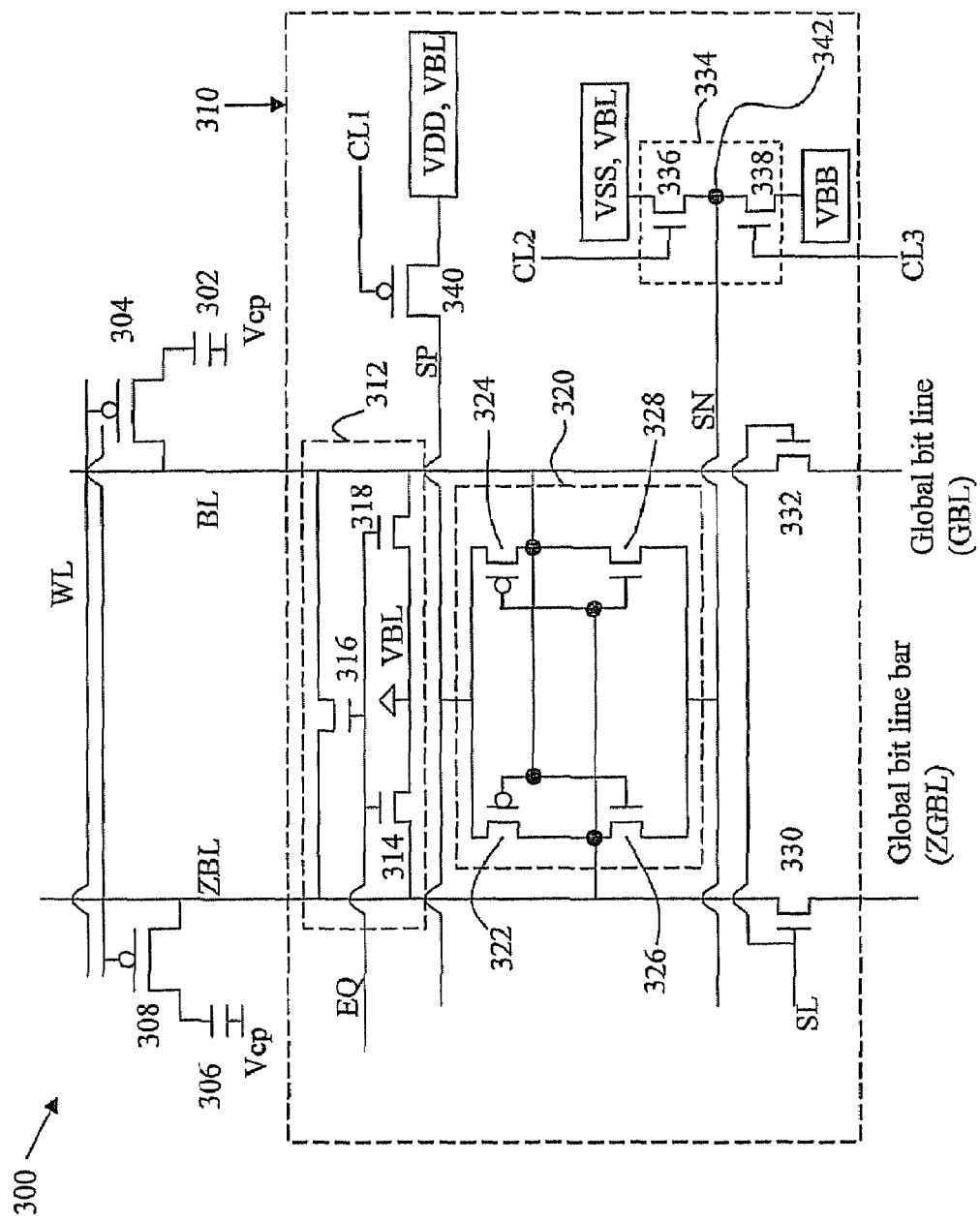
FIG. 3 illustrates an exemplary embodiment of a DRAM circuit of the present invention.

FIG. 3 illustrates an exemplary DRAM circuit 300 according to one embodiment of the present invention. Note that a DRAM circuit generally includes multiple DRAM cells and various additional periphery circuitry (e.g., write circuitry, word line decoders, digital line decoders, additional equalization, and the like). However, for the purposes of clarity and brevity, additional DRAM cells and periphery circuitry are not shown or described herein.

DRAM circuit 300 includes a first storage bit 302 and a second storage bit 306. First storage bit 302 is coupled to a PMOS transistor 304, which is also coupled to bit line BL. Second storage bit 306 is coupled to a PMOS transistor 308, which is also coupled to the bit line bar ZBL. Sense amplifier 310 is connected to both the first storage bit 302 and second storage bit 306 via the bit line BL and the bit line bar ZBL. Sense amplifier 310 includes a pre-charge circuit 312, a back-to-back inverter 320 and two NMOS transistors 330, 332. The gates of NMOS transistors 330 and 332 are coupled to the column selection line SL. Pre-charge circuit 312 includes three NMOS transistors 314, 316, 318, each having its gate coupled to the equalization line EQ.

Back-to-back inverter 320 includes two PMOS transistors 322, 324 and two NMOS transistors 326, 328. NMOS transistors 326 and 328 may be formed by the same process as all of the other MOS transistors in DRAM circuit 300 because NMOS transistors 326 and 328 do not need to have low threshold voltages. Because all of the MOS transistors of the exemplary DRAM cell 300 may be made by the same process, and the extra photolithography steps (that were used for low threshold voltage NMOS) are no longer required, the process time and expense of manufacturing DRAM cell 300 are reduced. The gates of PMOS transistor 322 and NMOS transistor 326 are tied together and connected to both the bit line BL and the drains of PMOS transistor 324 and NMOS transistor 328. The drains of PMOS transistor 324 and NMOS transistor 328 are also tied together. The gates of PMOS transistor 324 and NMOS transistor 328 of back-to-back inverter 320 are tied together and connected to the bit line bar ZBL and the drains of PMOS transistor 322 and NMOS transistor 326, which are also tied together. The sources of PMOS transistors 322 and 324 are tied together and coupled to a high voltage source $V_{DD}$ via line SP and PMOS transistor 340, which has its gate tied to control line CL1. The sources of the NMOS transistors 326 and 328 are tied together and coupled to a switch 334 via line SN.

Switch 334 is operable between two voltage sources, $V_{BB}$ and $V_{SS}$, which are set at different voltages. $V_{SS}$ is typically set at ground, and $V_{BB}$ is set at a voltage lower than that of $V_{SS}$. In a preferred embodiment, $V_{BB}$ is set to a negative voltage between approximately −0.2 volts and −0.4 volts (assuming $V_{SS}$=0.0 volts). However, those skilled in the art will appreciate that other suitable voltages for $V_{BB}$ may be used. Switch 334 may be implemented through a variety of methods. In a preferred embodiment, switch 334 includes two NMOS transistors 336, 338 coupled together at a node 342. Node 342 is also connected to line SN as illustrated in FIG. 3. The gate of NMOS transistor 336 is coupled to control line CL2, and the gate of NMOS transistor 338 is coupled to control line CL3. When the DRAM circuit 300 is in the normal operating mode (i.e., retaining previously stored data, but not being written to, read from or refreshed), switch 334 connects line SN is to $V_{SS}$. In a preferred embodiment, line SN is coupled to $V_{SS}$ by connecting line CL2 to a high voltage signal to turn on NMOS transistor 336, and connecting control line CL3 to a low voltage signal to turn off NMOS transistor 338. When a read or refresh sequence is performed, switch 334 is coupled to $V_{BB}$ as explained below.

Figure 4:
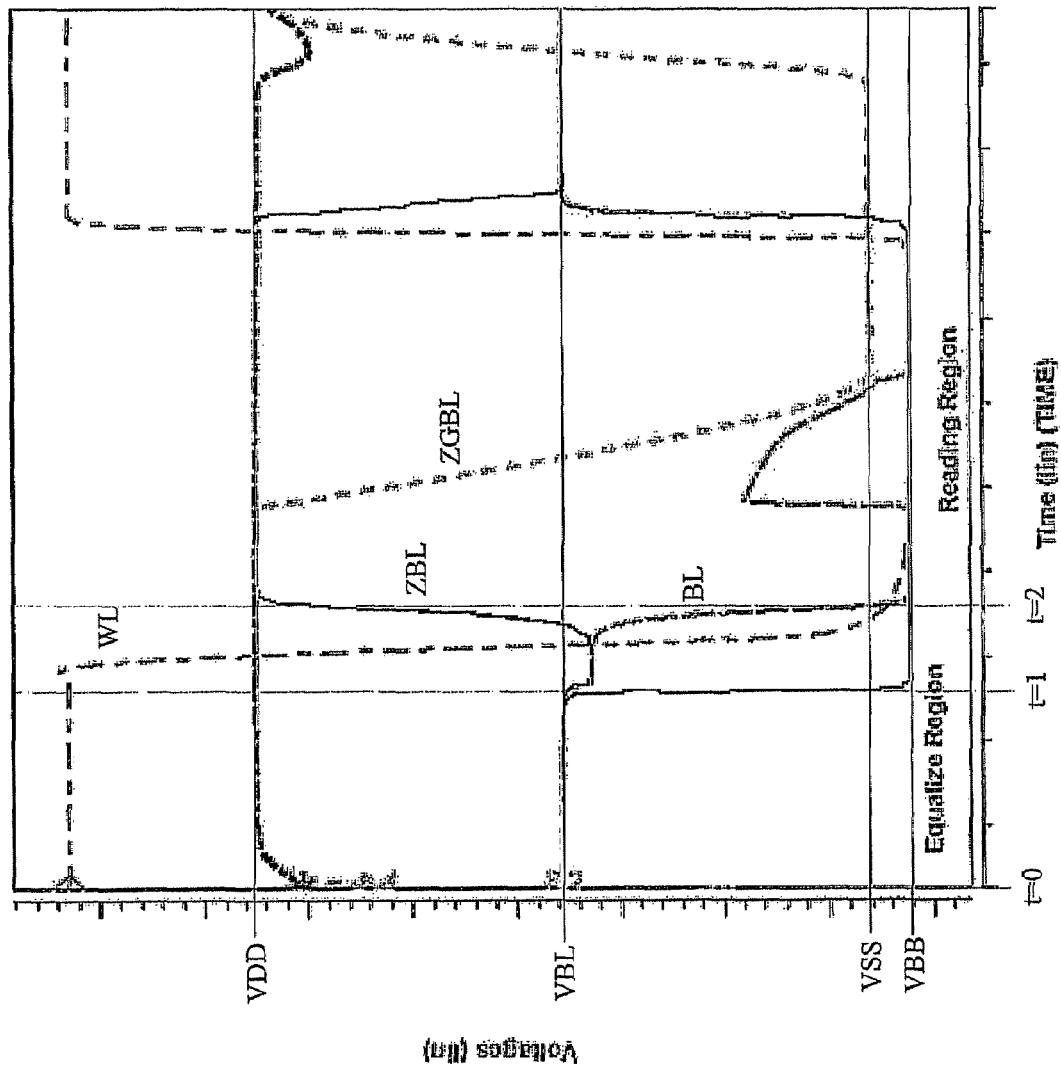
FIG. 4 illustrates a voltage versus time graph of the reading cycle of an exemplary embodiment of a DRAM circuit of the present invention.

With reference to FIG. 3, which is an exemplary schematic of a DRAM circuit, and FIG. 4, which illustrates a timing diagram of the DRAM circuit, the reading operation of a "0" in the first storage bit 302 is now described. At time t=0, circuit 300 is in the normal operation state, in which it is retaining previously stored data, but is not reading, writing or refreshing a storage bit. In this mode, the equalization line EQ is high, which turns on NMOS transistors 314, 316 and 318 of the pre-charge circuit 312. This results in lines ZBL and BL being pre-charged with the voltage of $V_{BL}$. In a preferred embodiment, voltage $V_{BL}$ is generally from about $0.5V_{DD}$ to approximately $0.55V_{DD}$, although other voltages may be used. Also in this mode, switch 334 is coupled to line SN, and is configured to couple line SN with $V_{SS}$, which is set at ground. The coupling of line SN with $V_{SS}$ is accomplished by having a high voltage signal on control line CL2 which turns on NMOS transistor 336, and having a low voltage signal on control line CL3, which turns off NMOS transistor 338. With NMOS transistor 336 on and NMOS transistor 338 off, the voltage of $V_{SS}$ develops at node 342. Also in this state, line SP is disconnected from $V_{DD}$ by having a high voltage signal on control line CL1, which turns off PMOS transistor 340. With line SP floating and line SN set at ground, both of the PMOS transistors 322, 324 and NMOS transistors 326, 328 of the back-to-back inverter 320 are in the "off" state.

When a read or refresh of DRAM circuit 300 is initiated, line EQ is turned to the "off" state by connecting it to ground. This causes the voltages of BL and ZBL to float at approximately $V_{BL}$. At time t=1, line WL is used to turn PMOS transistor 304 on, by transitioning it from a high voltage to a low voltage. However, alternative embodiments (not shown) utilize other transistors (instead of PMOS transistors) to couple capacitors 302 and 306 to lines BL and ZBL, respectively. When line WL transitions from high to low at time t=1, PMOS transistor 304 turns on, and the voltage of the connected capacitor 302 starts to develop on line BL. Line SP is then coupled to $V_{DD}$ by transitioning the voltage signal on CL1 from a high voltage signal to a low voltage signal, which turns on PMOS transistor 340. Line SN is switched from $V_{SS}$ to $V_{BB}$ via switch 334. The orientation of switch 334 is changed by transitioning line CL2 from a high voltage signal to a low voltage signal turning off NMOS transistor 336, and by transitioning line CL3 from a low voltage signal to a high voltage signal to turn on NMOS transistor 338. With NMOS transistor 338 in the "on" state, the voltage of node 342 is pulled down to the voltage of $V_{BB}$.

Figure 1:
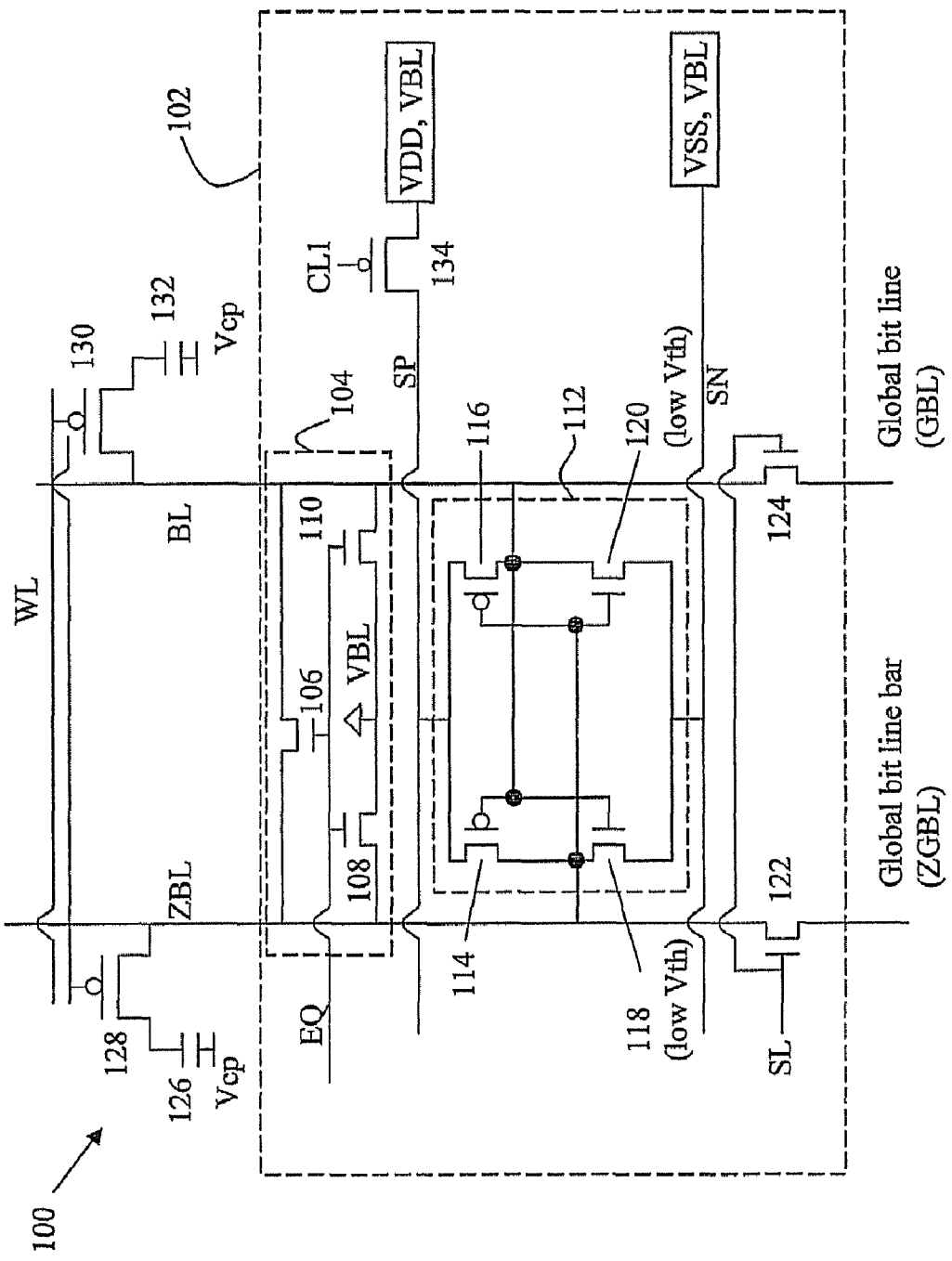
FIG. 1 illustrates a prior art version of a DRAM circuit.
Figure 2:
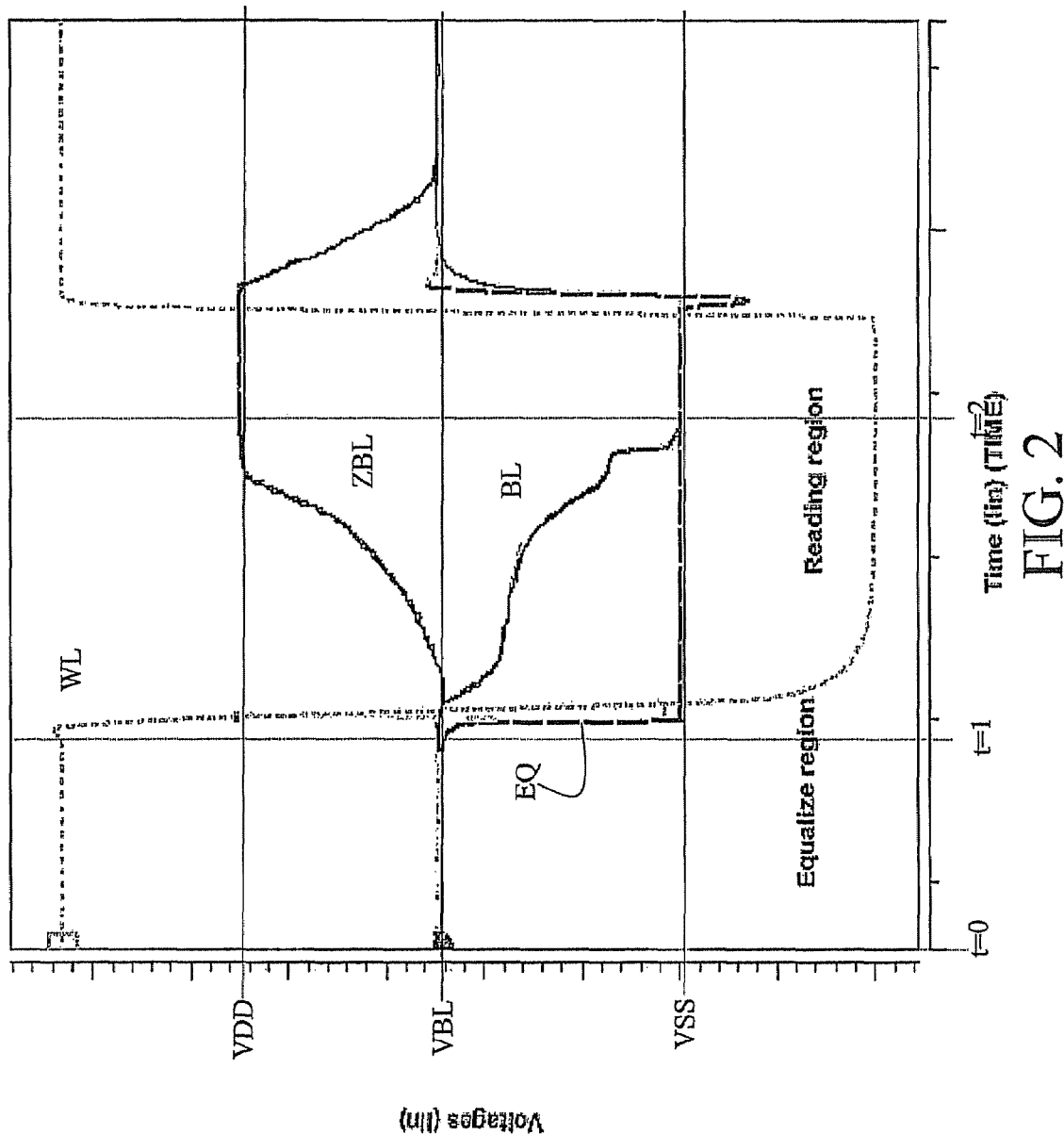
FIG. 2 illustrates a voltage versus time graph of the reading cycle of a prior art DRAM circuit.

Because the voltage of $V_{BB}$ is approximately -0.2V to about -0.4V, the voltage difference between line SN and line SP is greater than the voltage difference would be if line SN were coupled to ground. This enables line BL to more quickly transition down from $V_{BL}$ to a logic "0". In addition to line BL transitioning from $V_{BL}$ to a logic "0" state more quickly, more charge can be removed from the capacitor 302. With less charge on the capacitor, the "0" logic value stored in memory is more definite because a larger voltage difference exists between the capacitor and the pre-charge voltage $V_{BL}$. Accordingly, the more definite the "0" value in storage is, the less frequently the cell needs to be refreshed, because it takes longer for sufficient charge to leak onto the capacitor to result in an indefinite signal. Since the circuit needs to be refreshed less frequently, the power consumed by the circuit is reduced. FIG. 4 illustrates the transition of line BL from $V_{BL}$ at time t=1 to a logic "0" state at time t=2. The steep slope of line BL from time t=1 to time t=2 is faster than the transitioning of BL illustrated in the circuit 100 in FIG. 2.

Figure 5:
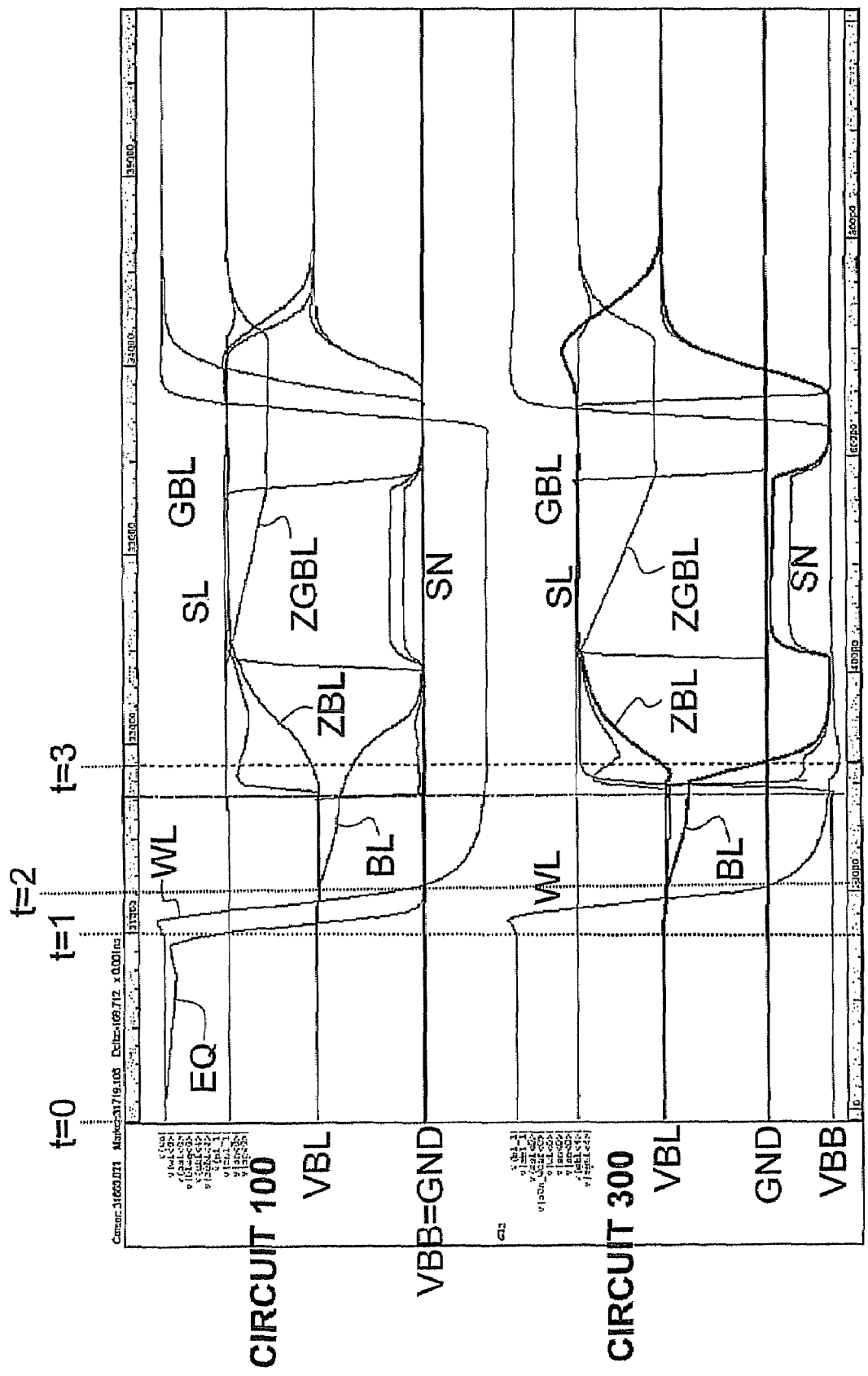
FIG. 5 illustrates a comparison of the voltage versus time graph of the reading cycle of the prior art circuit and the exemplary embodiment of the present invention.

FIG. 5 is a diagram of voltage versus time comparing the transition of various signals for the read or refresh cycle of a logic "0" state of circuit 100 with the same signals in circuit 300. The read or refresh of the value of capacitors 132 and 302 are illustrated in FIG. 5 where time is designated as the x-axis and voltage is designated as the y-axis. DRAM circuits 100 and 300 are in the normal operation mode at time t=0. At this time, line EQ is a logic "1" and lines BL and ZBL are charged with $V_{BL}$. At time t=1, line EQ begins to transition from a high to a low as the read or refresh cycle commences. The value "0" recorded in bits 132, 302 begins to develop on bit line BL at time t=2 and soon thereafter line ZBL begins to be pulled high by PMOS transistors 114 and 322 of circuit 100 and the exemplary embodiment circuit 300, respectively. At time t=3, line BL of the circuit 300 has been pulled all the way to zero; however, in contrast, line BL of prior art circuit 100 is still transitioning to zero.

Figure 6:
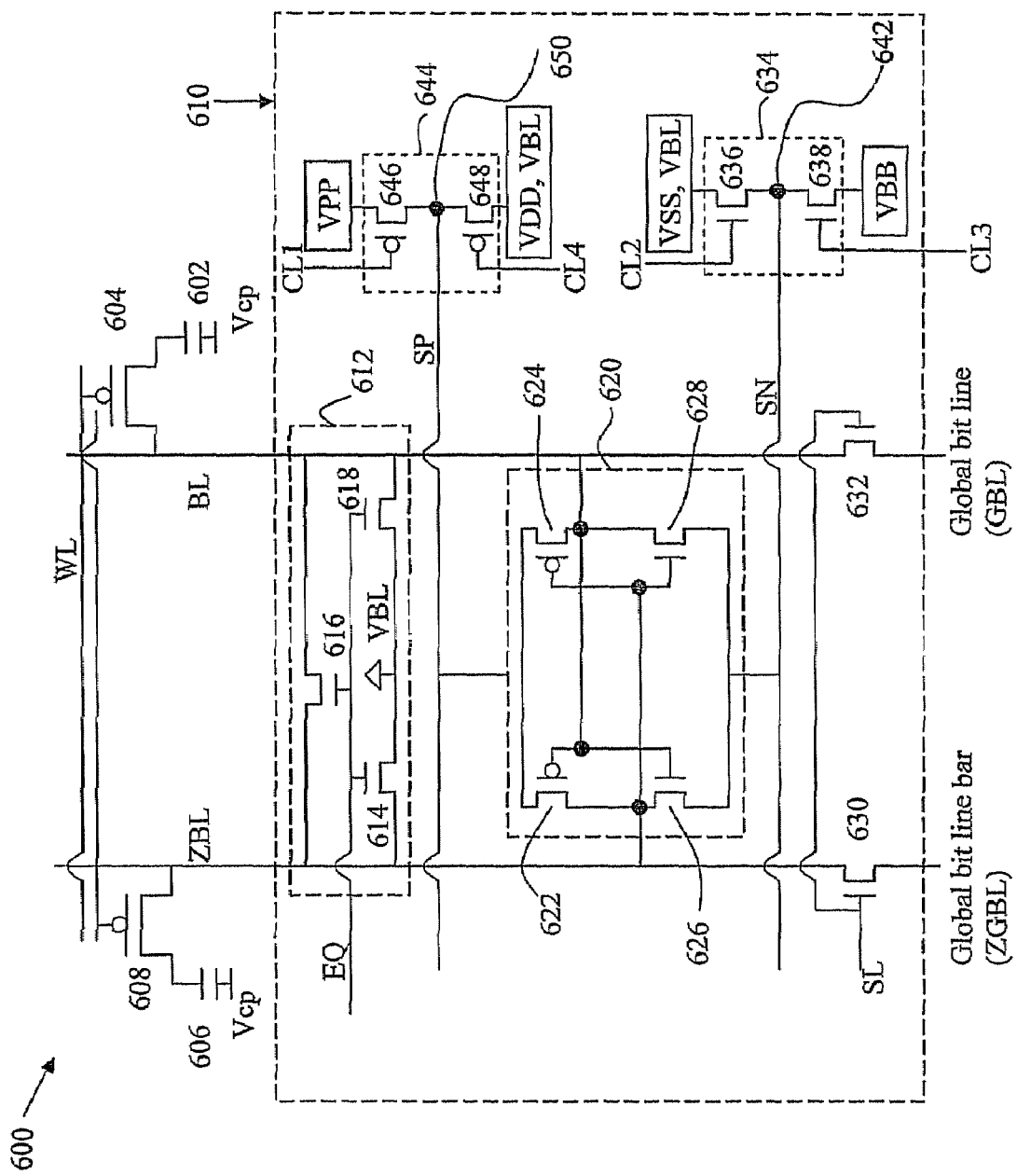
FIG. 6 illustrates another exemplary embodiment of a DRAM circuit of the present invention.

FIG. 6 illustrates an exemplary DRAM circuit 600 according to another embodiment. With regards to FIGS. 3 and 6, like features in the two figures are indicated by a reference numeral in FIG. 6 having the same two least significant digits as the feature in FIG. 3, but increased by 300. For example, transistor 604 in FIG. 6 can be the same structure as transistor 304 in FIG. 3. DRAM circuit 600 includes a first storage bit 602 and a second storage bit 606. First storage bit 602 is coupled to a PMOS transistor 604, which is also coupled to bit line BL. Second storage bit 606 is coupled to a PMOS transistor 608, which is also coupled to the bit line bar ZBL. Sense amplifier 610 is connected to both the first storage bit 602 and second storage bit 606 via the bit line BL and the bit line bar ZBL, respectively. Sense amplifier 610 includes a pre-charge circuit 612, a back-to-back inverter 620 and two NMOS transistors 630 and 632. The gates of NMOS transistors 630 and 632 are coupled to the column selection line SL. Pre-charge circuit 612 includes three NMOS transistors 614, 616, 618, each having its gate coupled to the equalization line EQ.

Back-to-back inverter 620 includes two PMOS transistors 622 and 624 and two NMOS transistors 626 and 628. The gates of PMOS transistor 622 and NMOS transistor 626 are tied together and connected to both the bit line BL and the drains of PMOS transistor 624 and NMOS transistor 628, which are also tied together. The gates of PMOS transistor 624 and NMOS transistor 628 of back-to-back inverter 620 are tied together and connected to the bit line bar ZBL and the drains of PMOS transistor 622 and NMOS transistor 626, which are also tied together. The sources of PMOS transistors 622 and 624 are tied together and coupled to a switch 644 via line SP. Likewise, the sources of the NMOS transistors 626 and 628 are tied together and coupled to a switch 634 via line SN.

Switch 644 is operable between two voltage sources $V_{DD}$ and $V_{PP}$, which are both set to voltages higher than ground. In a preferred embodiment, $V_{PP}$ is set at a voltage from about $V_{DD}+0.2$ volts to about $V_{DD}+0.6$ volts. Switch 644 may be implemented through a variety of methods. In a preferred embodiment, switch 644 includes two PMOS transistors 646, 648 coupled together at a node 650. Node 650 is also connected to line SP as illustrated in FIG. 6. The gate of PMOS transistor 646 is coupled to control line CL1, and the gate of PMOS transistor 648 is coupled to control line CL4. When the DRAM circuit 600 is in the normal operating mode (i.e., retaining previously stored data, but not being written to, read from or refreshed), line SP is coupled to $V_{DD}$ through switch 644. In a preferred embodiment, line SP is coupled to $V_{DD}$ by connecting control line CL4 to a low voltage signal, which turns on PMOS transistor 648, and connecting control line CL1 to a high voltage signal, which turns off PMOS transistor 646. When a read or refresh sequence is performed, switch 644 is coupled to $V_{PP}$ by transitioning the voltage signal on control line CL4 from a low voltage to a high voltage and transitioning the voltage signal on control line CL1 from a high voltage to a low voltage.

The reading operation of a "0" in the first storage bit 602 of exemplary DRAM circuit 600 is now described. Initially, DRAM circuit 600 is in the normal operation state, in which it is retaining previously stored data, but is not reading, writing or refreshing a storage bit. In this mode, the equalization line EQ is high, which turns on NMOS transistors 614, 616 and 618 of the pre-charge circuit 612. This results in lines ZBL and BL being pre-charged with the voltage of $V_{BL}$. In a preferred embodiment, voltage $V_{BL}$ is generally from about $0.5V_{DD}$ to approximately $0.6V_{DD}$, although other voltages may be used. Also in this mode, switch 634 is coupled to line SN, and is configured to couple line SN with $V_{SS}$, which is set at ground. The coupling of line SN with $V_{SS}$ is accomplished by having a high voltage signal on control line CL2 which turns on NMOS transistor 636, and having a low voltage signal on control line CL3, which turns off NMOS transistor 638. With NMOS transistor 636 on and NMOS transistor 638 off, the voltage of $V_{SS}$ develops at node 642.

Also in this state, line SP is floating by disconnecting SP from $V_{DD}$ and $V_{PP}$ by having high voltage signals on control lines CL1 and CL4. In the active region (sensing region) control line CL1 is on, and a high voltage is applied. In the equalize region nodes line SN, line SP, bit line BL, and bit line bar ZBL are pulled to $V_{BL}$. A high voltage signal on control line CL1 turns off PMOS transistor 646, and a high voltage signal on control line CL4 turns off PMOS transistor 648. Both of the PMOS transistors 622, 624 and NMOS transistors 626, 628 of the back-to-back inverter 620 are in the "off" state.

When a read or refresh of DRAM circuit 600 is initiated, line EQ is turned to the "off" state by connecting it to ground. This causes the voltages of BL and ZBL to float at approximately $V_{BL}$. Then, line WL is used to turn PMOS transistor 604 on, by transitioning it from a high voltage to a low voltage. However, alternative embodiments (not shown) utilize other transistors (instead of PMOS transistors) to couple capacitors 602 and 606 to lines BL and ZBL, respectively. When line WL transitions from high to low, PMOS transistor 604 turns on, and the voltage of the connected capacitor 602 begins to develop on bit line BL. Line SP is then coupled to $V_{DD}$ by transitioning the voltage signal on control line CL1 from a high voltage signal to a low voltage signal, turning on PMOS transistor 648. Line SN is switched from $V_{SS}$ to $V_{BB}$ via switch 634. The orientation of switch 634 is changed by transitioning control line CL2 from a high voltage signal to a low voltage signal turning off NMOS transistor 336, and by transitioning control line CL3 from a low voltage signal to a high voltage signal to turn on NMOS transistor 338. With NMOS transistor 338 in the "on" state, the voltage of node 642 is pulled down to the voltage of $V_{BB}$. In the active region (sensing region) CL1 and CL3 are in the "on" state, and CL4,CL3 are in the "off" state. Thus, $V_{PP}$ and $V_{BB}$ are applied. In the equalize region (word line WL turned off) nodes SN, SP, BL, ZBL are all pulled to $V_{BL}$ With respect to the reading speed at low voltage, while in the writing mode or refresh mode, SP/SN do not switch to $V_{PP}/V_{BB}$, and instead just use $V_{DD}$ and $V_{SS}$.

Because the voltage of $V_{BB}$ is approximately $-0.2V$ to about $-0.4V$, the voltage difference between line SN and line SP is greater than the voltage difference would be if line SN were coupled to ground. This enables line BL to more quickly transition down from $V_{BL}$ to a logic "0". In addition to line BL transitioning from $V_{BL}$ to a logic "0" state more quickly, more charge can be removed from the capacitor 302. With less charge on the capacitor, the "0" logic value stored in memory is more definite because a larger voltage difference exists between the capacitor and the pre-charge voltage $V_{BL}$. Accordingly, the more definite the "0" value in storage is, the less frequently the cell needs to be refreshed, because it tales longer for sufficient charge to leak onto the capacitor to result in an indefinite signal. Since the circuit needs to be refreshed less frequently, the power consumed by the circuit is reduced.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A DRAM circuit comprising:
  at least one memory cell comprising a capacitor and a transistor coupled to the capacitor, the at least one memory cell coupled to a bit line; and
  at least one sense amplifier comprising a pre-charge circuit and a back-to-back inverter coupled to the bit line during normal operation of the DRAM circuit and during a read or refresh operation, the back-to-back inverter having at least one PMOS transistor and at least one NMOS transistor, wherein a source of the at least one PMOS transistor is configured to be coupled to a first voltage source set at a voltage higher than ground through a first MOS transistor, and a source of the at least one NMOS transistor is coupled to second and third MOS transistors, the second MOS transistor is operable to connect the source of the at least one NMOS transistor to a second voltage source set at ground during normal operation of the DRAM circuit, the third MOS transistor is operable to connect the source of the at least one NMOS transistor to a third voltage source set at a negative voltage relative to the second voltage source during the read or refresh operation of the DRAM circuit.

2. The DRAM circuit as claimed in claim 1 wherein the third voltage source has a voltage approximately $-0.2$ volts to $-0.4$ volts relative to ground.

3. The DRAM circuit as claimed in claim 1 wherein the third MOS transistor is configured to couple the at least one NMOS transistor to the third voltage source during the read or refresh operation.

4. The DRAM circuit as claimed in claim 1 wherein the second MOS transistor is configured to coupled the at least one NMOS transistor to the second voltage source during normal operation.

5. The DRAM circuit as claimed in claim 2 wherein the back-to-back inverter further comprises a second PMOS transistor having a source coupled to the first voltage source through the first MOS transistor.

6. The DRAM circuit as claimed in claim 5 wherein the back-to-back inverter further comprises a second NMOS transistor having a source coupled to the second and third MOS transistors.

7. A DRAM circuit comprising:
  at least one memory cell coupled to one of a bit line or a bit line bar; and
  at least one sense amplifier connected to the memory cell, the sense amplifier comprising:
    a pre-charge circuit connected to a first voltage source; and
    a back-to-back inverter connected to the pre-charge circuit and configured to be coupled to the bit line and the bit line bar during normal, read, and refresh operations of the DRAM circuit, the back-to-back inverter including a first PMOS transistor having a source, a second PMOS transistor having a source, a first NMOS transistor having a source, and a second NMOS transistor having a source, a first MOS transistor coupled to the sources of the first and second PMOS transistors and to a second voltage source having a voltage set at around, and a second MOS transistor coupled to the sources of the first and second PMOS transistors and to a third voltage source having a voltage set below ground, the second MOS transistor configured to connect the sources of the first and second PMOS transistors to the third voltage source during read and refresh operations of the DRAM circuit.

8. The DRAM circuit of claim 7 further comprising a third MOS transistor coupled to the sources of the first and second NMOS transistors and to a fourth voltage source having a voltage source that is set at a voltage that is approximately twice a voltage of the first voltage source; and a fourth MOS transistor coupled to the sources of the first and second NMOS transistors and to a fifth voltage source set at a voltage that is about 0.2 volts to 0.4 volts more than the fourth voltage source relative to ground.

9. The DRAM circuit of claim 8 wherein the sources of the first and second NMOS transistors are connected to the fourth voltage source during normal operation of the DRAM circuit.

10. The DRAM circuit of claim 9 wherein the sources of the first and second NMOS transistors are connected to the fifth voltage source during read and refresh operations of the DRAM circuit.

11. The DRAM circuit as claimed in claim 7, wherein the third voltage source is set at a voltage that is approximately 0.2 volts to 0.4 volts lower than the voltage of the second voltage source.

12. A method of sensing a DRAM circuit comprising:

providing a DRAM circuit having a memory cell coupled to one of a bit line or a bit line bar, a sense amplifier including a pre-charge circuit and a back-to-back inverter, the back-to-back inverter coupled to the bit line and bit line bar and including first and second NMOS transistors, each having a source, and first and second PMOS transistors, each having a source;

maintaining the sources of the first and second NMOS transistors coupled to a first voltage source during normal operation of the DRAM circuit; and performing a refresh or refresh operation including:
maintaining the back-to-back inverter coupled to the bit line and bit line bar;
coupling the sources of the first and second PMOS transistors to a second voltage source set at a higher voltage than the first voltage source to turn on each of the transistors of the back-to-back inverter; and
coupling the sources of the first and second NMOS transistors to a third voltage source set at a lower voltage than the first voltage source during the read or refresh operation.

13. The method of sensing a DRAM circuit as claimed in claim 12, wherein the first voltage source is set at ground and the DRAM circuit further includes:

first, second, and third MOS transistors, the first MOS transistor coupled between the sources of the first and second PMOS transistors and the first voltage source, the second MOS transistor coupled between the sources of the first and second NMOS transistors and the second voltage source, and the third MOS transistor coupled between the sources of the first and second NMOS transistors and the third voltage source.

14. The method of sensing a DRAM circuit as claimed in claim 13, wherein the third voltage source is set at approximately −0.2 volts to −0.4 volts relative to ground.

15. The method of sensing a DRAM circuit as claimed in claim 12 further comprising:

coupling the sources of the first and second PMOS transistors to a fourth voltage source during read and refresh operations.

16. The method of sensing a DRAM circuit as claimed in claim 15, wherein the fourth voltage source is set at a higher voltage than the second voltage source relative to ground.

17. The method of sensing a DRAM circuit as claimed in claim 16, wherein the fourth voltage source is set approximately 0.2 volts to 0.4 volts higher than the second voltage source relative to ground.

* * * * *

UNITED STATES PATENT AND TRADEMARK OFFICE
CERTIFICATE OF CORRECTION

PATENT NO. : 7,663,953 B2 Page 1 of 1
APPLICATION NO. : 11/684811
DATED : February 16, 2010
INVENTOR(S) : Hank Cheng, Chen-Hui Hsieh and Chung-Cheng Chou It is certified that error appears in the above-identified patent and that said Letters Patent is hereby corrected as shown below:

Column 8, line 41, Claim 4, delete "coupled" and insert -- couple --.

Column 9, line 3, Claim 7, delete "around" and insert -- ground --.

Signed and Sealed this

Twenty-seventh Day of April, 2010

David J. Kappos
*Director of the United States Patent and Trademark Office*